United States Patent
Schneider et al.

(10) Patent No.: US 7,208,957 B2
(45) Date of Patent: Apr. 24, 2007

(54) METHOD FOR NON-CONTACT TESTING OF FIXED AND INACCESSIBLE CONNECTIONS WITHOUT USING A SENSOR PLATE

(75) Inventors: Myron J. Schneider, Ft. Collins, CO (US); Kenneth P. Parker, Ft. Collins, CO (US); Chris R. Jacobsen, Ft. Collins, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/069,406

(22) Filed: Mar. 1, 2005

(65) Prior Publication Data

US 2006/0197539 A1 Sep. 7, 2006

(51) Int. Cl.
*G01R 31/08* (2006.01)

(52) U.S. Cl. .................. 324/519; 324/658; 324/761

(58) Field of Classification Search ................ 234/609; 324/519
See application file for complete search history.

(56) References Cited

U.S. PATENT DOCUMENTS

| 5,420,500 | A | 5/1995 | Kerschner |
| 5,498,964 | A | 3/1996 | Kerschner et al. |
| 5,557,209 | A | 9/1996 | Crook et al. |
| 7,057,395 | B1 * | 6/2006 | Williamson ................ 324/519 |

* cited by examiner

*Primary Examiner*—Vincent Q. Nguyen

(57) ABSTRACT

A method for testing for a defect condition on a node-under-implicit-test of an electrical device is presented. The technique according to the invention includes stimulating a first node of the electrical device that is capacitively coupled to the node-under-implicit-test with a known source signal, and capacitively sensing a signal on a second node of the electrical device that is capacitively coupled to the node-under-implicit-test. A defect condition such as a short or open can be determined from the capacitively sensed signal.

18 Claims, 9 Drawing Sheets

PRIOR ART

METHOD FOR NON-CONTACT TESTING OF FIXED AND INACCESSIBLE CONNECTIONS WITHOUT USING A SENSOR PLATE

BACKGROUND OF THE INVENTION

The present invention relates generally to integrated circuit assembly testing, and more particularly to a method for non-contact testing of fixed and inaccessible connections without using a capacitive sensor plate.

Capacitive probe testing is frequently used in determining the integrity of integrated circuit connections. Capacitive probe testing utilizes non-contact capacitive coupling technologies, for example those described in U.S. Pat. No. 5,557,209 to Crook et al., entitled "Identification Of Pin-Open Faults By Capacitive Coupling Through The Integrated Circuit Package", U.S. Pat. No. 5,420,500 to Kerschner, entitled "Capacitive Electrode System For Detecting Open Solder Joints In Printed Circuit Assemblies", and U.S. Pat. No. 5,498,964 to Kerschner et al., entitled "Capacitive Electrode System For Detecting Open Solder Joints In Printed Circuit Assemblies", all of which are hereby incorporated by reference for all that they teach.

Capacitive probe testing has not traditionally been used to test fixed pins or tied pins because of the lack of diagnostic separability and presence of significant capacitance due to board-mounted bypass capacitors. A fixed pin is usually considered to be a power or ground pin because it cannot be moved easily with a test stimulus. A tied pin is considered to be any pin for which several other pins on the same device (such as an integrated circuit or connector) share the same node. Note that because devices such as integrated circuits and connectors typically provide multiple power and ground pins, the power and ground fixed pins may also be tied pins as well. For purposes of this patent, the terms "fixed" and "tied" will be used interchangeably because the differences in terms of the present invention are slight.

Recent patent applications U.S. patent application Ser. No. 10/703,944, entitled "Methods and Apparatus For Testing And Diagnosing Open Connections For Sockets And Connectors On Printed Circuit Boards" to Parker et al, and U.S. patent application Ser. No. 10/836,862, entitled "Methods and Apparatus For Non-Contact Testing And Diagnosing Open Connections For Connectors On Printed Circuit Boards" to Parker et al., each of which is incorporated by reference for all that it teaches, collectively describe a method for testing opens on fixed/tied pins on connectors. The method described tests the connector fixed pins implicitly by analyzing inherent capacitive structures present in the network. FIG. 1 is a schematic diagram of a test setup illustrating the prior art non-contact techniques described. As illustrated, the test setup 10 includes a tester 20, a board 30 being tested by the tester 20, a device 40 on the board, and a capacitive sense plate 50 and amplifier circuitry 60 of a capacitive sensor device. In operation, an AC signal 22 is applied to a signal pin 41 which is capacitively coupled ($C_c$) to the fixed pin 43 which is being implicitly tested via a capacitor 42 inherently formed between the pins 41, 43. A sense plate 50 is positioned above the device 40, forming capacitors ($C_s$) 52, 54 between the sense plate 50 and pins 41, 43 of the device 40. Nearby amplifier circuitry 62 is used to sense, amplify, and filter noise from an AC current signal $I_s$ related to an effective capacitance $C_{eff}$ between the sense plate 50 and device 40. Hardware and software in the tester 20 convert the measured AC current signal $I_s$ into a capacitance value $C_{eff}$.

If no defect is present at pin 43 with connection joint 32 (i.e., no open exists), the tester 20 will simply measure the capacitance value $C_S$ due to capacitor 52. If an open defect is present at connection joint 32, a capacitance $C_{open}$ 34 is introduced between the device and the board to which it is soldered. This, combined with capacitance $C_s$ provided by capacitor 54, results in an effective capacitance $C_{eff}$ at the sense plate of ($Cs+\Delta$). The diagnostic software in the tester 20 recognizes this higher reading as a defect.

This concept is extended to not only include fixed open pins, but also inaccessible shorted pins by U.S. patent application Ser. No. 10040181, to Parker, entitled "Methods And Apparatus For Non-Contact Testing And Diagnosing Of Inaccessible Shorted Connections". Inaccessible pins are considered to be pins for which the tester does not have probe access and therefore cannot stimulate with an AC source. The coverage of inaccessible pins is not limited to connectors but can also include integrated circuit devices.

The prior art capacitive probing testing techniques mentioned above all rely upon an external sense plate and external amplification and signal conditioning hardware in the tester's fixture to obtain the capacitive measurements. This hardware can be costly in terms of parts, engineering time, and installation time. Installation of the hardware into the tester fixture can also add debug time due to problems when the sense plate is not properly aligned over the device under test, when there are poor connections, when the hardware is installed incorrectly, or when the hardware is defective.

In addition, the ability of the tester software to diagnose a defect is dependent on the measurement accuracy of the readings. As mentioned, when implicitly testing the capacitively coupled pin, the effective capacitance on the signal pin measures $C_s$ when good and $C_s+\Delta$ when defective. The accuracy of the tester must be good enough to reliably discriminate between these two values given their measurement uncertainties. Measurement uncertainty is a natural byproduct of any measurement system. On many successive measurements of the same value, a range of readings will be observed that will form a bell curve peaked near the actual value of the property being measured. FIG. 2 is a graph illustrating capacitance measurement bell curves for a signal pin with a good (or NoDefect) connection ($C_s$) (curve 81), and the same signal pin with a defective (or Defect) connection ($C_s+\Delta$) (curve 82), as measured on a tester with small measurement uncertainty. As shown, the tester with small measurement uncertainty can easily discriminate between the NoDefect connection and the Defect connection.

FIG. 3 is a graph illustrating capacitance measurement bell curves for a signal pin with a good (or NoDefect) connection ($C_s$) (curve 83), and the same signal pin with a defective (or Defect) connection ($C_s+\Delta$) (curve 84), as measured on a tester with higher measurement uncertainty. As shown, the tester with higher measurement uncertainty cannot reliably discriminate between the NoDefect connection and the Defect connection. With the given measurement accuracy of the tester used to make the measurements in FIG. 3, there is some overlap 85 of the bell curves. Any reading that occurs in the overlap area 85 is ambiguous as to indicating a defect. The only solution for obtaining a reliable test coverage is to increase the difference between the Defect and NoDefect readings, which will separate the two bell curves 86 and 87 in FIG. 4. The same tester that had reliability problems in FIG. 3 does not have the reliability problems in FIG. 4 because of a larger $\Delta$. Unfortunately, $\Delta$ is not a modifiable parameter for the tester. Rather, Δ is a function of $C_s$ and $C_c$ in FIG. 1, which are device characteristics.

Accordingly, it would be desirable to have a technique which allows an increased Δ to avoid ambiguity in capacitive measurement readings. It would also be desirable to have a technique for a non-contact measurement system that does not require a sensor plate to make the capacitive measurements.

SUMMARY OF THE INVENTION

The present invention provides a technique for testing the integrity of a node of an electrical device using non-contact capacitive coupling techniques without the use of a sense plate. The method of the invention includes steps of stimulating a first node (for example at one or more first signal pins) of an electrical device (for example, an integrated circuit (IC)) with a known source signal, physically connecting a measuring device to a second node of the electrical device that is capacitively coupled to the node-under-implicit-test, and measuring, with the measuring device, a signal present on the second node, the measured signal indicative of a presence or a non-presence of a defect condition on the node-under-implicit test. Each of the first node and the second node is capacitively coupled to the node-under-implicit-test. The capacitively sensed signal is representative of the effective capacitance between the first node and the second node, as affected by the node-under-implicit test. Accordingly, based on the value of the capacitively sensed signal, the presence or lack of presence of a defect condition on the node-under-implicit-test of the electrical device can be identified.

The technique of the invention not only eliminates the use of a sensor plate, and therefore reduces cost through elimination of additional hardware and engineering/setup/debug time, but it also allows the Δ to be increased through selection of strong coupling capacitances of the first and second nodes with the node-under-implicit-test.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

As used herein, the term "node" refers to the conductive portion of an electrical device that forms a single electrical point in the equivalent schematic diagram of the electrical device. For example, a node can be a pad of an integrated circuit die, a pin, a wire, a solder bump, or other interconnecting joint of an integrated circuit device, a pad or trace of a printed circuit board, an interconnecting joint of a component on the printed circuit board, or any combination thereof.

The present invention will be described in detail with reference to illustrative embodiments wherein the device under test is an integrated circuit and the nodes-under-implicit-test are input and/or output joints (taking the form of pads, pins, lead wires, lead frames, wire bonds, solder bumps, or other now-known or hereinafter developed electrical interconnects for joining input and/or output nodes of an electronic devices such as an integrated circuit to a printed circuit board). In the particular embodiments described, the stimulus and response nodes are, or are connected to, signal pins of an integrated circuit, and the node-under-implicit-test comprises either a fixed or tied pin, or an inaccessible node. Accordingly, the term "pin" and "node" may be used interchangeably in the context of the illustrative embodiments. It will also be appreciated that the present invention may be similarly applied to other types of electrical devices or circuit components (e.g., connectors and sockets) and nodes therein. The illustrative embodiments are presented by way of example only and not limitation, and it is intended that the invention be limited only by the claims.

The present invention is a method for non-contact testing of fixed/tied and/or inaccessible nodes without using a capacitive sensor plate. Unlike the prior art which implicitly tests a fixed or inaccessible node using one coupled signal pin and a sense plate, the present invention eliminates the sense plate altogether, substituting it with a second coupled signal pin.

1. Fixed Pins

Figure 5A:
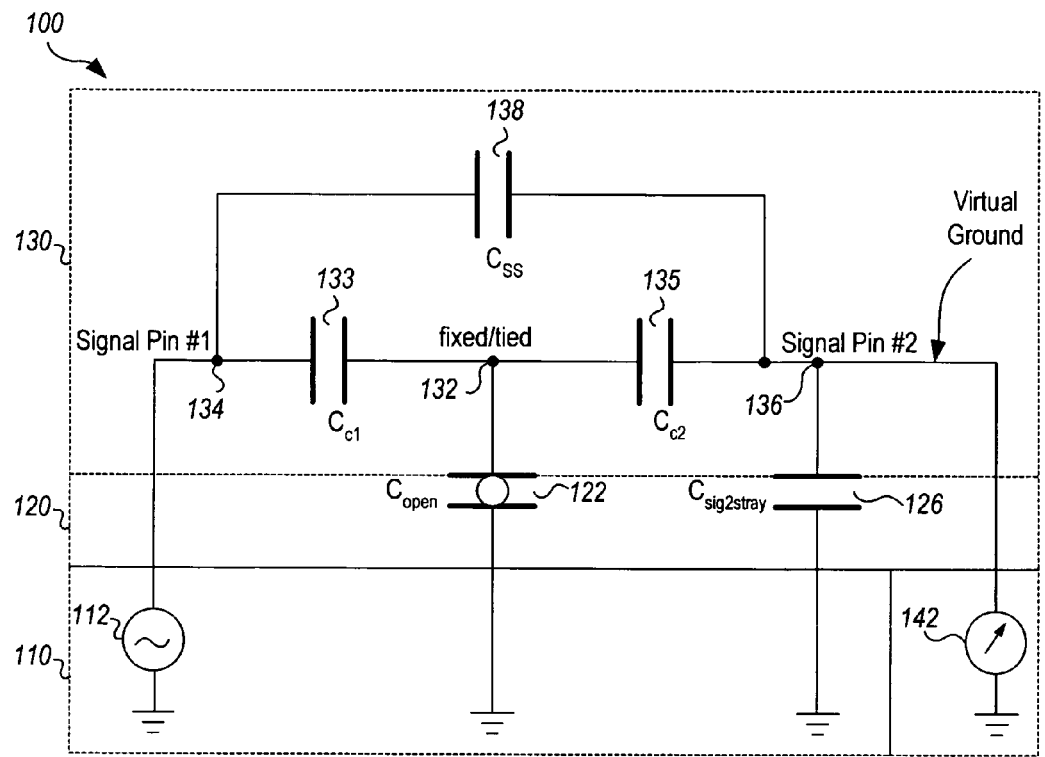
FIG. 5A is a schematic diagram of a test setup illustrating the technique of the invention as applied to testing a fixed pin.

In more detail, FIG. 5A is a schematic diagram of a test circuit 100 illustrating the technique of the invention as applied to testing a fixed pin 132. Structurally, as illustrated, an AC signal generator 112 in the tester 110 is coupled to a first signal pin 134 which is capacitively coupled via a coupling capacitance $C_{c1}$ 133 to the fixed pin 132 which is being implicitly tested (i.e., the node-under-implicit-test). Amplifier circuitry (e.g., including an amplifier circuit and current meter) 142 is coupled to a second signal pin 136 which is also capacitively coupled via coupling capacitance $C_{c2}$ 135 to the fixed pin 132 being implicitly tested. The first and second signal pins 134 and 136 are capacitively coupled via coupling capacitance $C_{ss}$ 138. Coupling capacitance $C_{open}$ 122 represents the capacitance of the open defect when the fixed pin 132 is not connected to the PCB 120. Coupling capacitance $C_{sig2stray}$ 126 represents the stray capacitance to ground of the second signal pin 136 in the PCB 120 or fixture wiring. The amplifier circuitry 142 is used to amplify the AC current signal related to the effective capacitance ($C_{eff}$) between the two signal pins 134, 136, and to filter noise on the current signal before sending it back to the tester 110. Hardware and software in the tester 110 convert this AC current signal into a capacitance value which may be used to distinguish between a NoDefect condition and a Defect condition on the fixed pin 132.

The amplifier circuitry 142 has traditionally been located in external fixture hardware 140 separate from the tester 110. Some or all of the functions of the amplifier circuitry 142 could alternatively be located in the tester 110 as long as the signal-to-noise ratio (SNR) of the AC current signal is sufficient for measurement purposes.

Figure 5B:
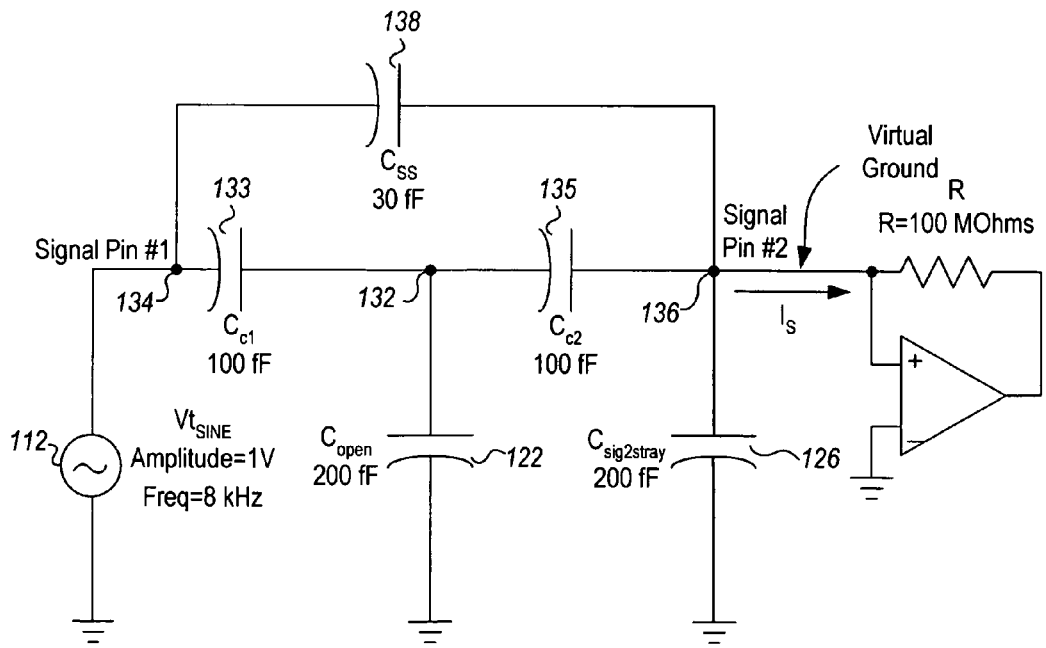
FIG. 5B is a schematic diagram showing a simulation circuit of the test setup of FIG. 5A.

FIG. 5B shows an example simulation circuit of the test setup of FIG. 5A. Example simulation values include: the AC input signal (1 volt at 8 kHz), the coupling capacitance values of $C_{c1}$ and $C_{c2}$ (100 fF each), the stray capacitance value of $C_{sig2stray}$ (200 fF), the open capacitance value of $C_{open}$ (if present, 200 fF), and the coupling capacitance value of $C_{ss}$ (30 fF). For simulation purposes, the test setup of FIG. 5B includes an operational amplifier and feedback resistor R (100 MOhms) in place of the tester in order to represent an ideal tester.

a. Fixed Pin Opens

In operation, an AC signal is applied to the first signal pin 134 which is capacitively coupled ($C_{c1}$) to the fixed pin 132 being implicitly tested. The amplifier circuitry 142 senses, amplifies, and filters noise from an AC current signal related to the effective capacitance ($C_{eff}$) of the structure. Hardware and software in the tester convert this AC current signal into a capacitance value.

When no defect is present at the fixed pin 132, $C_{open}$ 122 is shorted out and the effective capacitance $C_{eff}=C_{ss}$ because the virtual and real grounds prevent any other paths from contributing current to the amplifier 142. Thus, with no defect present, the tester will simply measure the effective capacitance value $C_{eff}=C_{ss}$.

Referring to FIG. 5B, when an open defect is present, the following calculations are true:

$$V_O = V \frac{Z_o \| Z_{C2}}{(Z_o \| Z_{C2}) + Z_{C1}} \quad \text{(Equation 1.1)}$$

$$V_O = V \frac{\frac{Z_o Z_{C2}}{Z_0 + Z_{C2}}}{\frac{Z_o Z_{C2}}{Z_0 + Z_{C2}} + Z_{C1}} \quad \text{(Equation 1.2)}$$

$$V_O = V \frac{Z_o Z_{C2}}{Z_o Z_{C2} + Z_o Z_{C1} + Z_{C1} Z_{C2}} \quad \text{(Equation 1.3)}$$

$$I_S = \frac{V}{Z_{SS}} + \frac{V}{Z_{C2}} \left( \frac{Z_o Z_{C2}}{Z_o Z_{C2} + Z_o Z_{C1} + Z_{C1} Z_{C2}} \right) \quad \text{(Equation 2.1)}$$

$$I_S = V \left( \frac{1}{Z_{SS}} + \frac{Z_o}{Z_o Z_{C2} + Z_o Z_{C1} + Z_{C1} Z_{C2}} \right) \quad \text{(Equation 2.2)}$$

$$C_{EFF} = \frac{I_S}{2\pi f V} \quad \text{(Equation 3)}$$

Thus, when an open defect is present, the defect capacitance $C_{open}$ 122 is introduced between the device 130 and the board 120. This results in an effective capacitance $C_{eff}=C_{ss}+\Delta$. The diagnostic software in the tester 110 recognizes this higher reading as a defect. $C_{sig2stray}$ 126 has little effect on the effective capacitance in either case because of the virtual ground. The amount of coupling between the signal pins 134, 136 does not affect the difference between the measurements for the Defect condition and NoDefect condition. It only offsets the effective capacitance $C_{eff}$ in both cases.

As with prior solutions, the effectiveness of the method of the invention is dependent on the amount of coupling $C_{ss}$ 138 between the signal pins 134, 136 and the fixed pin 132 that is being implicitly tested. It works best when both signal pins 134, 136 are strongly coupled to the fixed pin 132. Weaker coupling on one or both of the signal pins 134, 136 to the fixed pin 132 yields less Δ. Because two signal pins 134, 136 are used instead of one, the method of the invention can tolerate less coupling capacitance and give a higher Δ than the prior art solutions.

Figure 1:
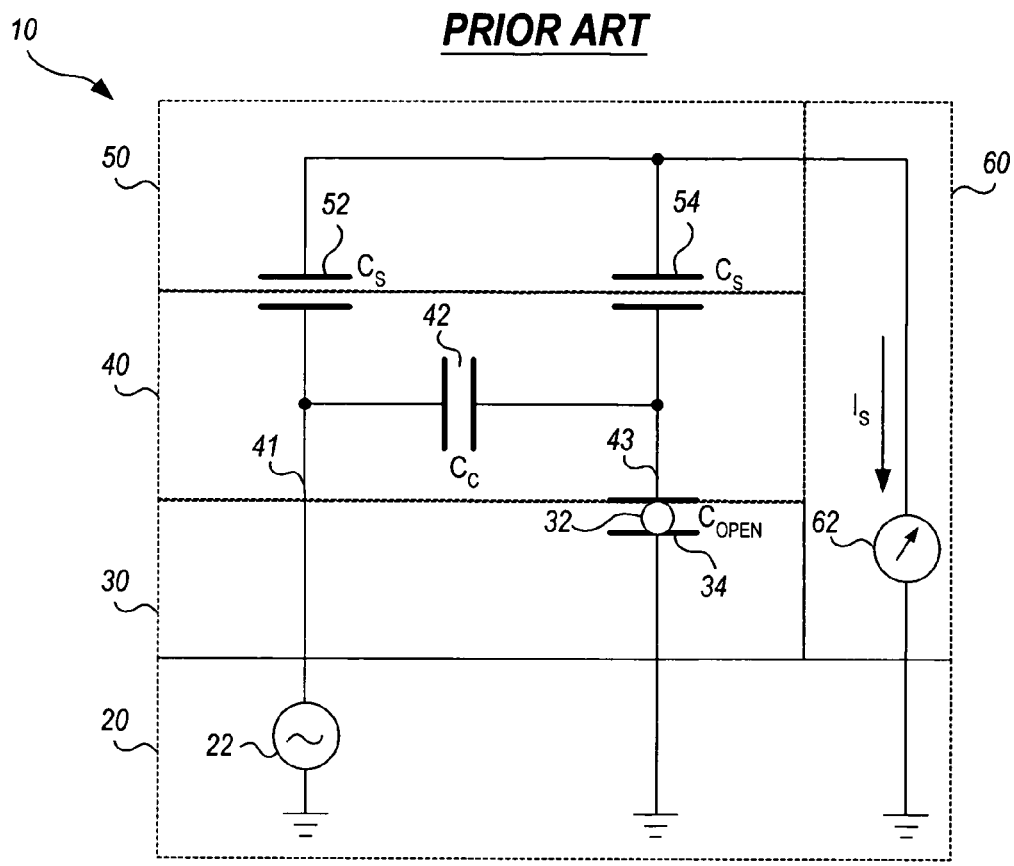
FIG. 1 is a schematic diagram of a test setup illustrating prior art non-contact testing techniques for nodes of an integrated circuit.
Figure 2:
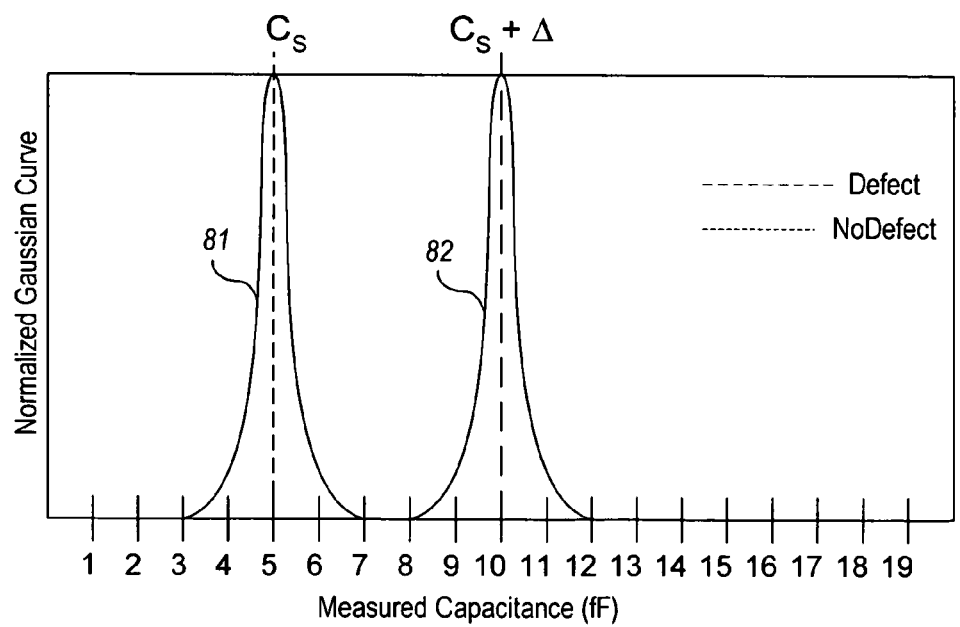
FIG. 2 is a graph illustrating capacitance measurement bell curves for capacitive measurement of a node exhibiting no defect and a node exhibiting a defect as measured on a tester with small measurement uncertainty and given Δ.
Figure 6:
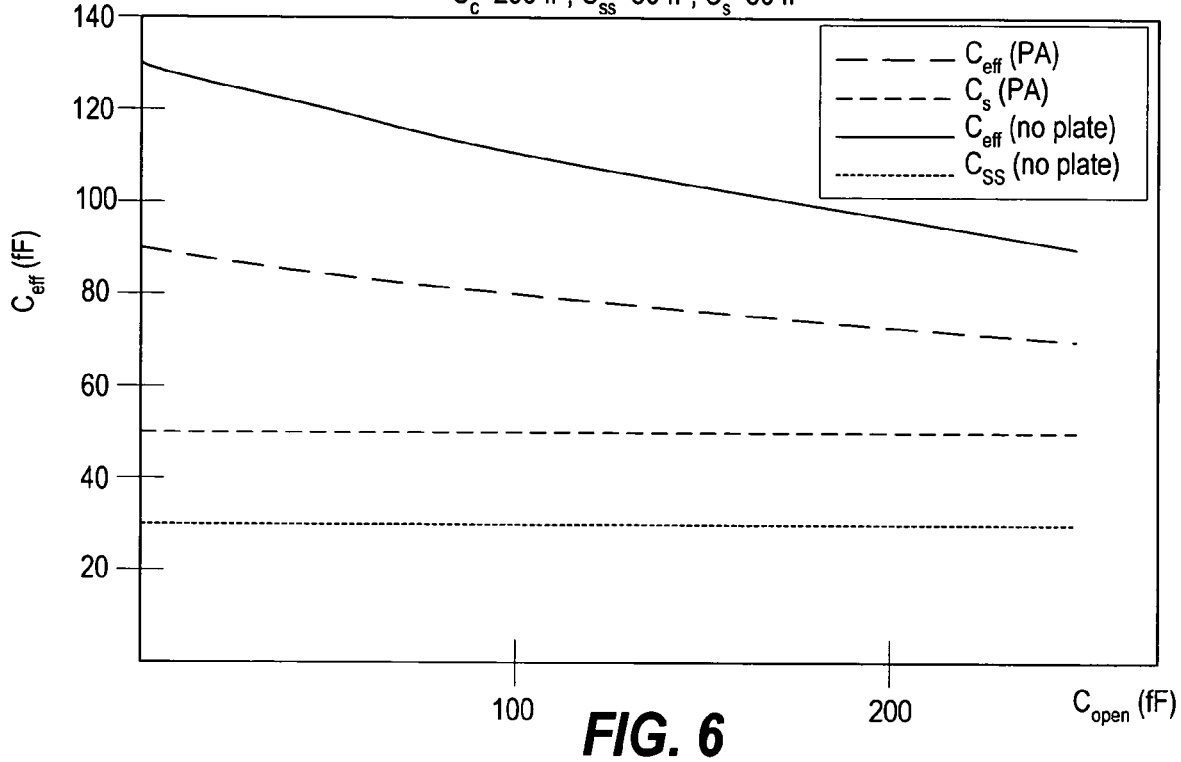
FIG. 6 is a graph illustrating simulation results for the prior art testing method illustrated in FIG. 1 (represented on the graph with "PA" for "prior art") and the simulation setup of the present invention as illustrated in FIG. 5B (represented on the graph with "no plate")

FIG. 6 compares some simulation results for the prior art testing method illustrated in FIG. 1 (represented on the graph with "PA" for "prior art") and the testing setup of the present invention as illustrated in FIG. 5A (represented on the graph with "no plate"). Δ for the prior art test setup is $C_{eff}$("PA")–$C_s$("PA"). Δ for the invention test setup of FIG. 5A is $C_{eff}$("no plate")–$C_{ss}$("no plate"). The graph shows that Δ is larger for the method of the present invention illustrated in FIG. 5A. As mentioned previously, larger Δ enhances diagnostic capability.

An interesting and very important by-product of having a larger Δ is the ability to detect a wider class of defective opens. The x-axis of FIG. 6 is plotted for the value of $C_{open}$ which is the value that the open defect presents to the circuit. If the x-axis was extended out to infinity, $C_{eff}$("no plate") would converge to $C_{ss}$("no plate") and $C_{eff}$("PA") would converge to $C_s$("PA"). $C_{eff}$("no plate") would converge at a higher value of $C_{open}$ than would $C_{eff}$("PA"). This wider range effectively represents a wider defect spectrum of opens.

b. Fixed Pin Shorts

It is not normally necessary for non-contact capacitive testing to be able to detect shorts between a signal pin and a fixed pin. Most testers includes a "shorts" test that quickly and easily diagnoses shorts as long as the tester has access to the signal and fixed pin nodes.

2. Inaccessible Pins

Figure 7A:
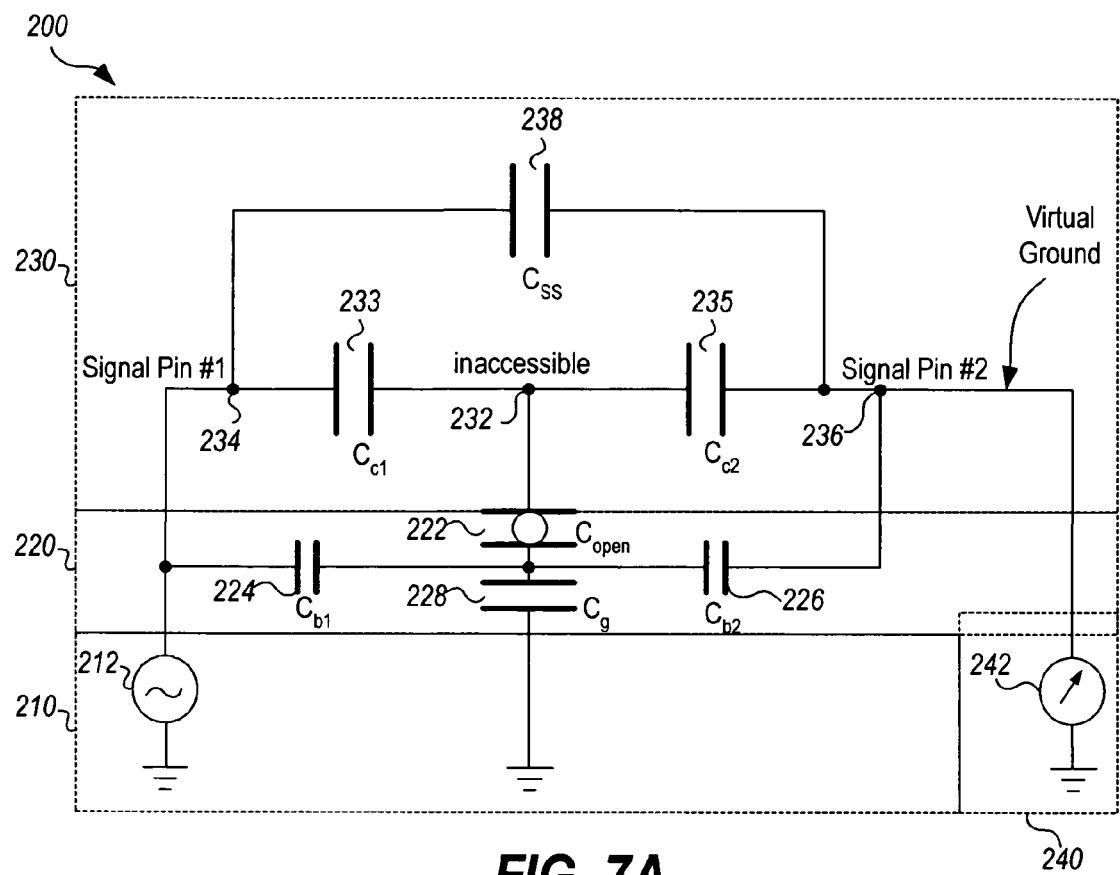
FIG. 7A is a schematic diagram of a test setup illustrating the technique of the invention as applied to testing an inaccessible node of an integrated circuit.

FIG. 7A is a schematic diagram of a test circuit 200 illustrating the technique of the invention as applied to testing an inaccessible pin 232. Structurally, as illustrated, an AC signal generator 212 is coupled to a first signal pin 234 which is capacitively coupled via coupling capacitance $C_{c1}$ 233 to the inaccessible pin 232 which is being implicitly tested (i.e., node-under-implicit-test). Amplifier circuitry 242 is coupled to a second signal pin 236 which is also capacitively coupled via coupling capacitance $C_{c2}$ 235 to the inaccessible pin 232 being implicitly tested. The first and second signal pins 234, 236 are capacitively coupled via coupling capacitance $C_{ss}$ 238. Coupling capacitance $C_{open}$ 222 represents the capacitance of the open defect when the inaccessible pin 232 is not soldered to the PCB 220.

Coupling capacitance $C_g$ 228 represents the capacitance between the unguarded node-under-implicit-test 232 to the PCB ground, and is included in the circuit because the tester 210 does not have access to the inaccessible node 232 and therefore cannot directly guard, stimulate, or measure it. The inaccessible node 232 will inherently exhibit a capacitance to ground.

Coupling capacitance $C_{b1}$ 224 represents the capacitance between the unguarded node-under-implicit-test 232 and the first signal pin 234 in the PCB 220. Coupling capacitance $C_{b2}$ 226 represents the capacitance between the unguarded node-under-implicit-test 232 and the second signal pin 236 in the PCB 220.

Figure 7B:
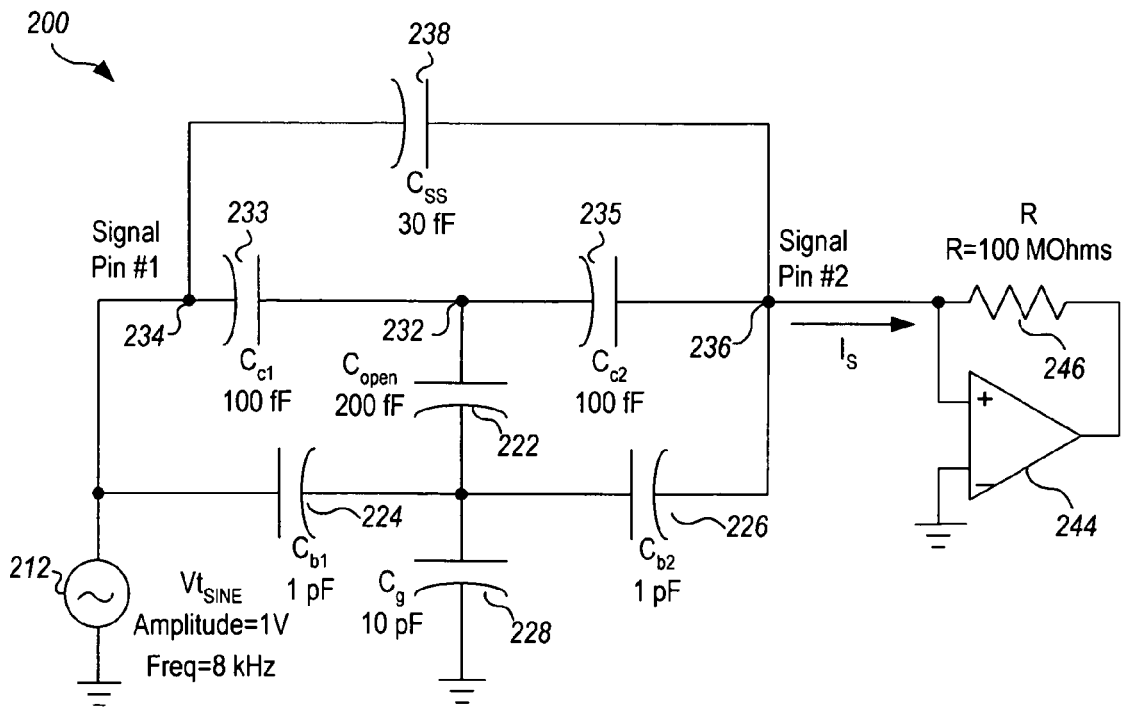
FIG. 7B is a schematic diagram showing the simulation circuit of the test setup of FIG. 7A.

FIG. 7B shows an example simulation circuit of the test setup of FIG. 7A. Example simulation values include: the AC input signal (1 volt at 8 kHz) 212, the coupling capacitance values of $C_{c1}$ 233 and $C_{c2}$ 235 (100 fF each), the coupling capacitance values of $C_{b1}$ 224 and $C_{b2}$ 226 (1 pF), the coupling capacitance value of $C_g$ 228 (10 pF), the open capacitance value of $C_{open}$ 222 (if present, 200 fF), and the coupling capacitance value of $C_{ss}$ 238 (30 fF). Again, for simulation purposes, the test setup of FIG. 7B includes an operational amplifier 244 and feedback resistor R (100 MOhms) 246 at the operational amplifier, in place of the tester in order to represent an ideal tester.

a. Inaccessible Pin Opens

In operation, an AC signal is applied by a signal generator 212 to the first signal pin 234 which is capacitively coupled ($C_{c1}$) to the inaccessible node/pin 232 being implicitly tested. Amplifier circuitry 242 senses, amplifies, and filters noise from an AC current signal related to the effective capacitance $C_{eff}$ of the structure. Hardware and software in the tester 210 convert this AC current signal into a capacitance value.

When no defect is present at the inaccessible pin, $C_{open}$ 222 is shorted out. The circuit 200 will resemble the circuit model of FIG. 5B once the parallel capacitances are combined and $C_{open}$ 122 in FIG. 5B is replaced with $C_g$ 228 of FIG. 7A. Thus, $$I_S = V\left(\frac{1}{Z_{SS}} + \frac{Z_o}{Z_g(Z_{C2} \| Z_{b2}) + Z_g(Z_{C1} \| Z_{b1}) + Z_{c1}(Z_{C2} \| Z_{b2})}\right)$$ (Equation 4)

The effective capacitance $C_{eff}$ may then be calculated according to Equation 3.

When an open defect is present, and referring to FIG. 7B, the current $I_S$ can be calculated as follows:

Defining:

$$A = Z_{b1}; B = Z_{b2}; C = Z_{C1}; D = Z_{C2}; E = Z_o; F = Z_g$$ (Equation 5.1)

$$\frac{V_O - V}{C} + \frac{V_o}{D} + \frac{V_O - V_g}{E} = 0$$

$$\frac{V_g - V_O}{E} + \frac{V_g - V}{A} + \frac{V_g}{B} + \frac{V_g}{F} = 0$$ (Equation 5.2)

$$\begin{bmatrix} \left(\frac{1}{C} + \frac{1}{D} + \frac{1}{E}\right) & \left(\frac{-1}{E}\right) \\ \left(\frac{-1}{E}\right) & \left(\frac{1}{E} + \frac{1}{A} + \frac{1}{B} + \frac{1}{F}\right) \end{bmatrix} \begin{bmatrix} V_o \\ V_g \end{bmatrix} = \begin{bmatrix} \frac{V}{C} \\ \frac{V}{A} \end{bmatrix}$$ (Equation 5.3)

Defining:

$$M = \frac{1}{C} + \frac{1}{D} + \frac{1}{E}; N = \frac{-1}{E}; P = \frac{-1}{E};$$ (Equation 5.4)

$$Q = \frac{1}{E} + \frac{1}{A} + \frac{1}{B} + \frac{1}{F}; L = \frac{V}{C}; \text{ and } R = \frac{V}{A},$$

$$\begin{bmatrix} (M) & (N) \\ (P) & (Q) \end{bmatrix} \begin{bmatrix} V_o \\ V_g \end{bmatrix} = \begin{bmatrix} L \\ R \end{bmatrix}$$

$$\begin{bmatrix} V_o \\ V_g \end{bmatrix} = \begin{bmatrix} \frac{NR - LQ}{NP - MQ} \\ \frac{PL - MR}{NP - MQ} \end{bmatrix}$$ (Equation 5.5)

$$I_S = \frac{V}{Z_{SS}} + \frac{V_o}{Z_{C2}} + \frac{V_g}{Z_{b2}}$$ (Equation 6)

Thus, when an open defect is present, the capacitance $C_{open}$ 222 is introduced between the device 230 and the board 220. This results in an effective capacitance $C_{eff}$ of ($C_{eff}+\Delta$), and as before, the diagnostic software in the tester 210 recognizes this higher reading as a defect.

As described above with respect to the fixed pin case, the effectiveness of the method of the invention is dependent on the amount of coupling between the signal pins 234, 236 and the inaccessible node 232 that is being implicitly tested.

b. Inaccessible Pin Shorts

Figure 7C:
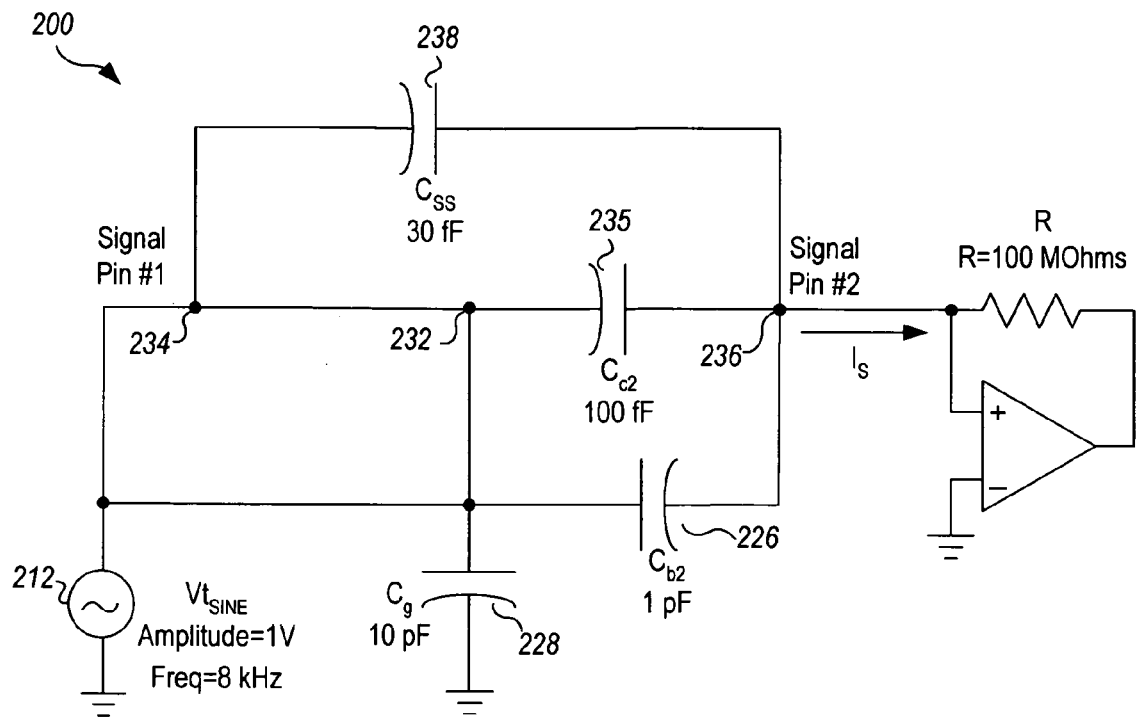
FIG. 7C is a schematic diagram showing the simulation circuit of the test setup of FIG. 7A when the defect condition is a short between the inaccessible node and the first signal pin of the device.
Figure 7D:
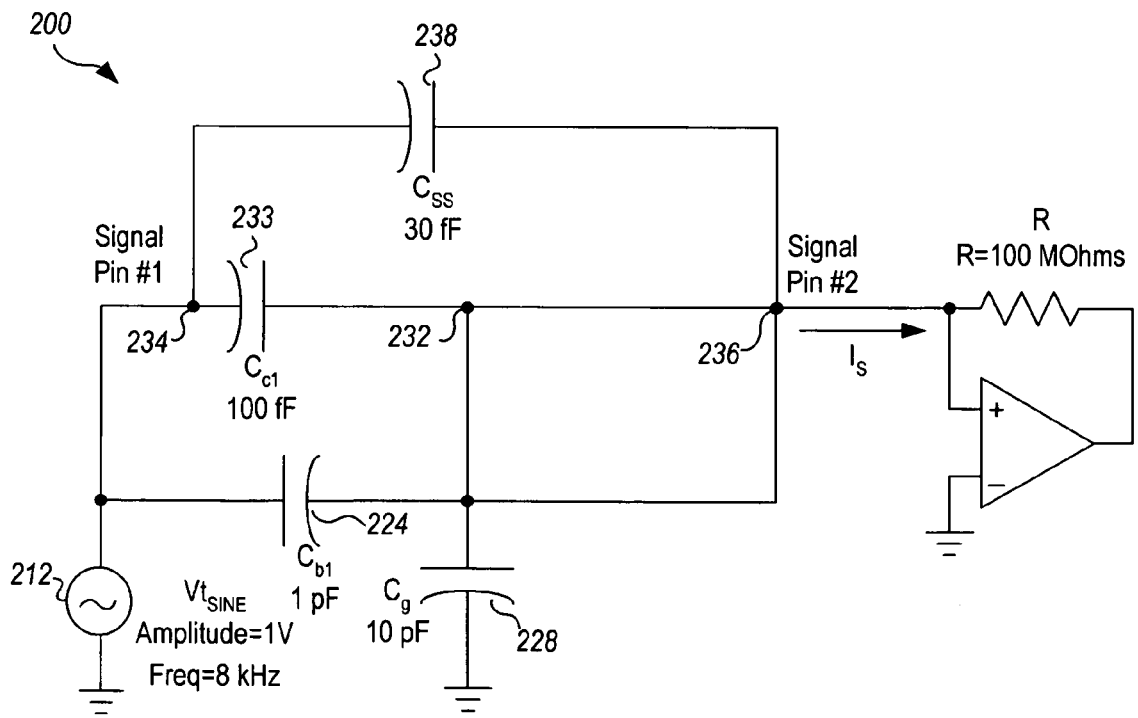
FIG. 7D is a schematic diagram showing the simulation circuit of the test setup of FIG. 7A when the defect condition is a short between the inaccessible node and the second signal pin of the device.

FIG. 7C is a schematic diagram illustrating the equivalent circuit of FIG. 7A when the defect condition is a short between the inaccessible node 232 and the first signal pin 234, and FIG. 7D is a schematic diagram illustrating the equivalent circuit of FIG. 7A when the defect condition is a short between the inaccessible node 232 and the second signal pin 236. As illustrated, the simulation circuit is the same as the open defect simulation circuit of FIG. 7B, except that $C_{open}$ 222 is replaced by a short, and either $C_{c1}$ and $C_{b1}$ are each replaced by a short or $C_{c2}$ and $C_{b2}$ are each replaced by a short.

With no defect present, the circuit and calculation resemble the circuit of FIG. 5B, but combining the parallel capacitances $C_{c1}$ and $C_{b1}$, and combining the parallel capacitances $C_{c2}$ and $C_{b2}$, and replacing $C_{open}$ 122 with $C_g$ 228. Thus, Equation 4 applies.

When a short defect is present between the first signal pin 234 and the inaccessible node 232, coupling capacitances, $C_{c1}$ and $C_{b1}$ are eliminated by the short, as shown in FIG. 7C. Thus, $$C_{EFF} = C_{SS} + C_{C2} + C_{b2}$$ (Equation 7)

When a short defect is present between the second signal pin 236 and the inaccessible node 232, coupling capacitances $C_{c2}$ and $C_{b2}$ are eliminated by the short, as shown in FIG. 7D. Thus, $$C_{EFF} = C_{SS} + C_{C1} + C_{b1} \qquad \text{(Equation 8)}$$

Figure 8A:
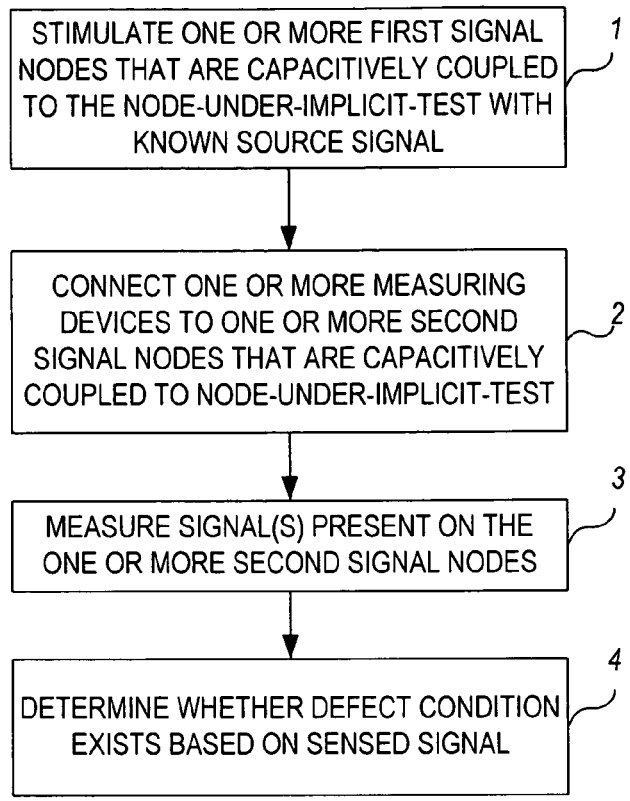
FIG. 8A is an operational flowchart of a test method of the invention.

FIG. 8A is an operational flowchart illustrating the testing method of the invention. As shown therein, the operational steps include the step 1 of stimulating a first node of the electrical device that is capacitively coupled to the node-under-implicit-test with a known source signal, the step 2 of physically connecting a measuring device to a second node of the electrical device that is capacitively coupled to the node-under-implicit-test, a step 3 of measuring a signal on the second node that is representative of the effective capacitance between the first node and the second node, as affected by the node-under-implicit test, and the step 4 of determining whether a defect condition exists on the node of the electrical device based on the measured signal.

Figure 8B:
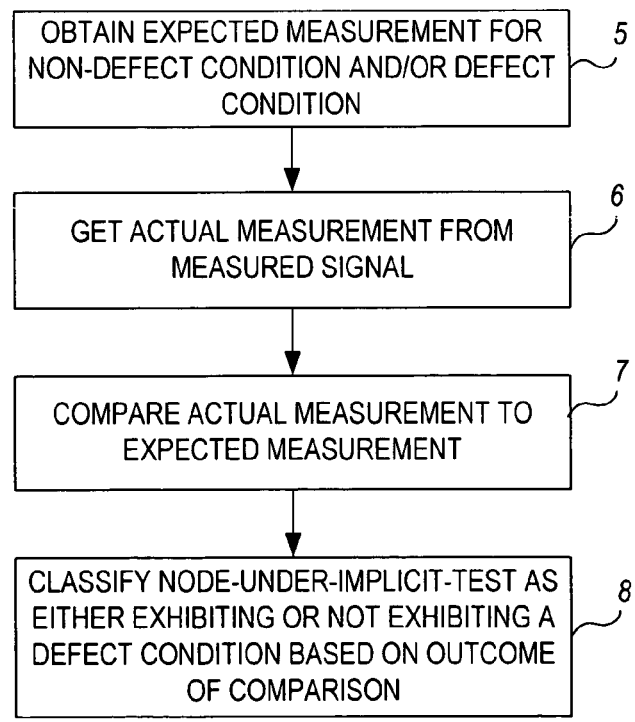
FIG. 8B is an operational flowchart of a method for determining whether a defect condition exists on the node-under-implicit-test tested in FIG. 8A.

FIG. 8B shows an operational flowchart illustrating a method for determining whether a defect condition exists on the node based on the measured signal. As shown therein, the operational steps include the step 5 of obtaining an expected measurement indicative of the capacitance on the node-under-implicit-test for at least one of a non-defect condition or a defect condition. In the preferred embodiment, the expected measurement is the expected value of current $I_S$ present on the second node when the node-under-implicit test does not exhibit a defect (either a short or open). In other embodiments, the expected measurement may be the expected value of the current $I_s$ present on the second node when the node-under-implicit test does exhibit a defect (either a short or open). In still other embodiments, the expected value may be in the form or voltage or actual capacitance, or any other unit of measurement derivable from the measured signal. In practice, a known good board is typically used to establish the test limits for the software. Since the board is known to be good (i.e., all connections intact), the values of the capacitive measurements obtained from the measured signal are assumed to be known good and may be used to determine the test limits for the expected capacitive measurements for the non-defect condition. Any measurement outside the test limits would then be considered as falling within the defect condition. Conversely, or in addition, a known "bad" board known to exhibit the defect condition of interest (e.g., short or open) on the connection of interest (e.g., pin connection to board) may be used to determine the test limits for the expected capacitive measurements for the defect condition of interest.

The operational steps further include the step 6 of obtaining an actual measurement from the capacitively sensed signal representing the capacitance on the node-under-implicit-test. In the preferred embodiment, the actual measurement is the actual value of current $I_s$ present on the second node. In other embodiments, the actual measurement may be in the form or voltage or actual capacitance, or any other unit of measurement. The actual measurement may be in the form and units desired (e.g., measured current in amperes), or may be derivable from the measured signal (e.g., current derived from a voltage reading).

The operational steps further include the step 7 of comparing the actual measurement to the expected measurement. In order to perform the comparison, the form and units of the expected measurement and actual measurements must, of course, conform—that is, the values of both must be stated in the same form (e.g., current) with the same units of measurement (e.g., milliamps).The method also includes the step 8 of classifying the accessible node either as exhibiting or not exhibiting a defect condition based on results of the comparing step. Steps 6, 7, and 8 are typically performed with a software program.

Figure 9:
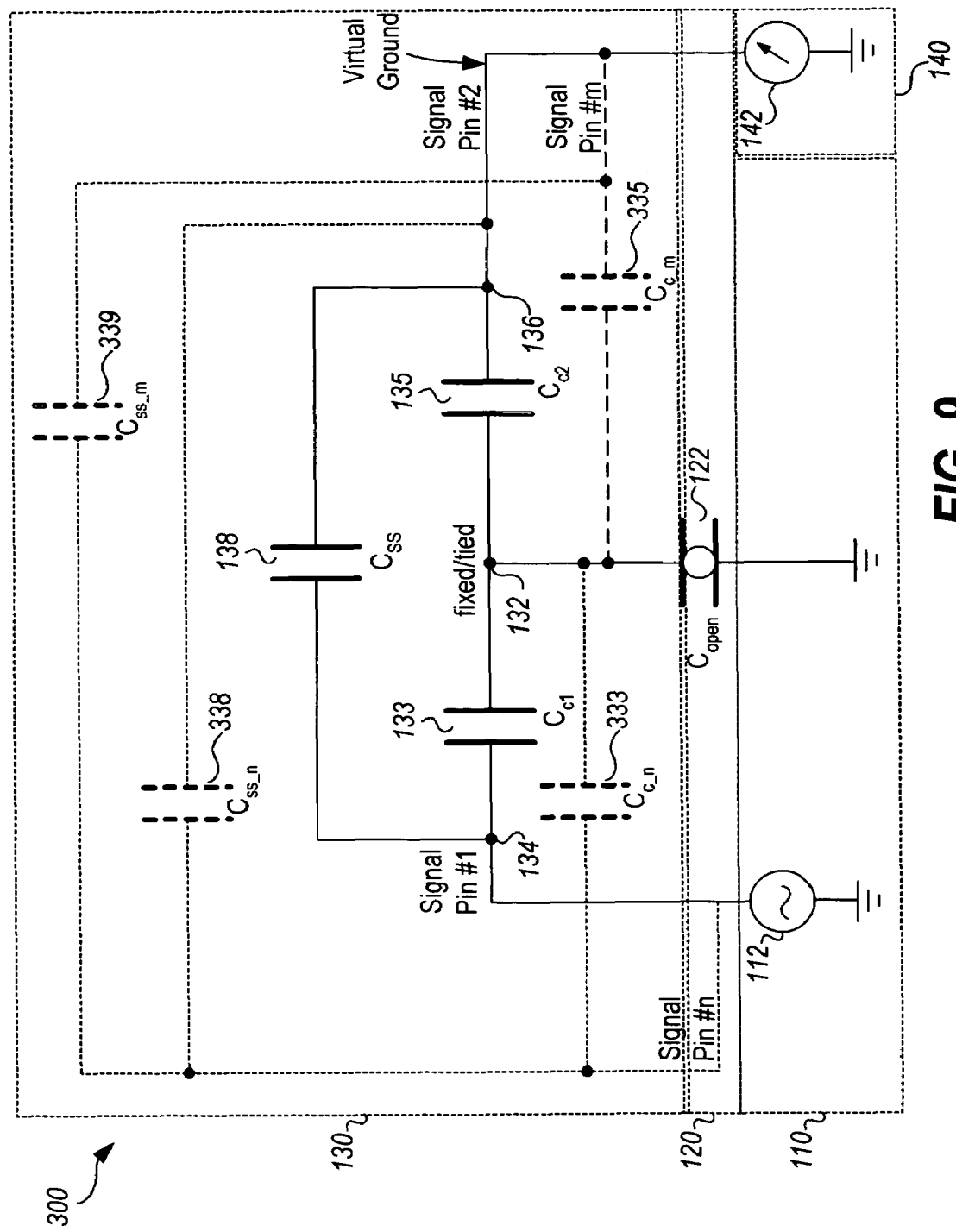
FIG. 9 is a schematic diagram of a test setup implemented in accordance with the invention illustrating the case where multiple stimulus and response pins are included.

As will be appreciated by those skilled in the art, Δ, and therefore the ability for the tester to distinguish between a Defect condition and a NoDefect condition, is affected by the amount of coupling $C_{c1}$ and $C_{C\_2}$ between each of the signal pins and the node being implicitly tested. Therefore, in the case that one or both of the chosen signal pins are only weakly capacitively coupled to the node-under-implicit test, multiple stimulus pins and/or multiple response pins that are coupled to the pin-under-implicit-test may be stimulated and/or sensed. FIG. 9 is a schematic diagram of a test setup 300 illustrating the case where multiple stimulus and response pins are included. For simplicity of illustration and due to its negligible impact, $C_{sig2stray}$ has been omitted.

The contributions of additional stimulus pins n are represented by the capacitances $C_{c\_n}$ 333 and $C_{ss\_n}$ 338 whereas additional response pins m are represented by $C_{c\_m}$ 335 and $C_{ss\_m}$ 339. One skilled in the art will also recognize the following circuit simplifications: $C_{c\_1}$ with $C_{c\_n}$ can be combined by addition, $C_{c\_2}$ with $C_{c\_m}$ can be combined by addition, and likewise $C_{SS}$, $C_{SS\_m}$, and $C_{SS\_n}$ can be combined by addition. Implementation of these simplifications will result in a system that again looks like the equivalent circuit shown in FIG. 5B, but with larger capacitance values.

Figure 10:
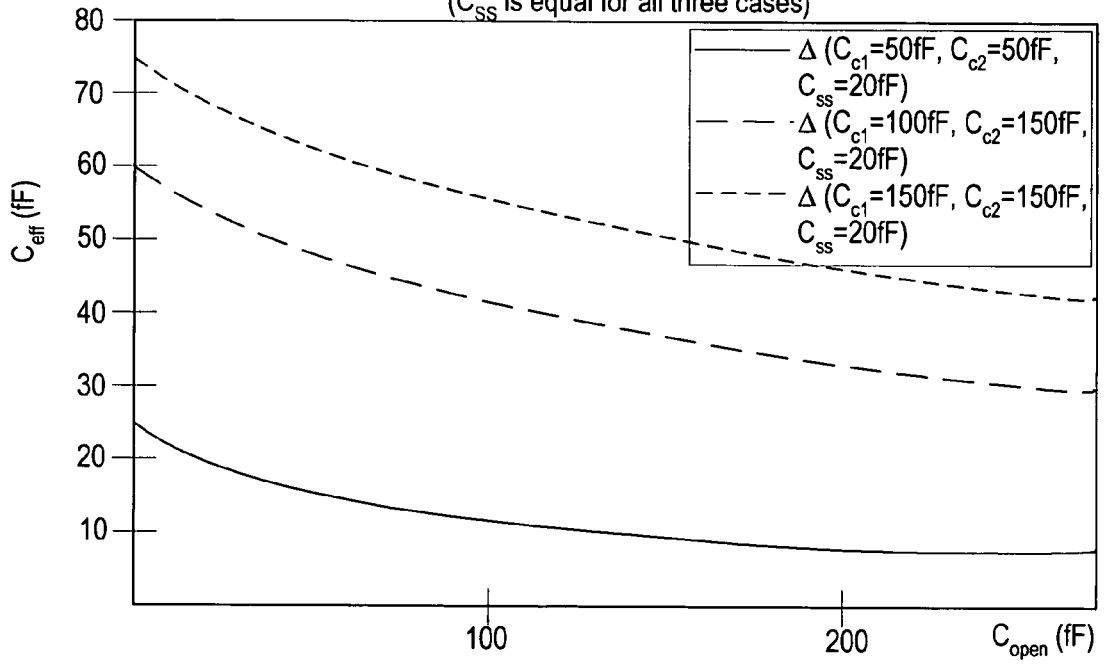
FIG. 10 is a graph illustrating tester Δ values versus open connection capacitance for different capacitive coupling values of the stimulus and response signal pins.

A larger total value for $C_{SS}$ does not aid or inhibit the ability to detect defects. Rather, it merely offsets the results in both the Defect and NoDefect cases. Larger values of the coupling capacitances $C_{c1}$ and $C_{C2}$ between the signal pins and the node-under-implicit-test result in a greater Δ. The graph of FIG. 10 illustrates that larger coupling capacitance values $C_{c1}$ and $C_{C2}$ effectively increase the Δ for the test, therefore increasing diagnostic reliability and detection.

Figure 3:
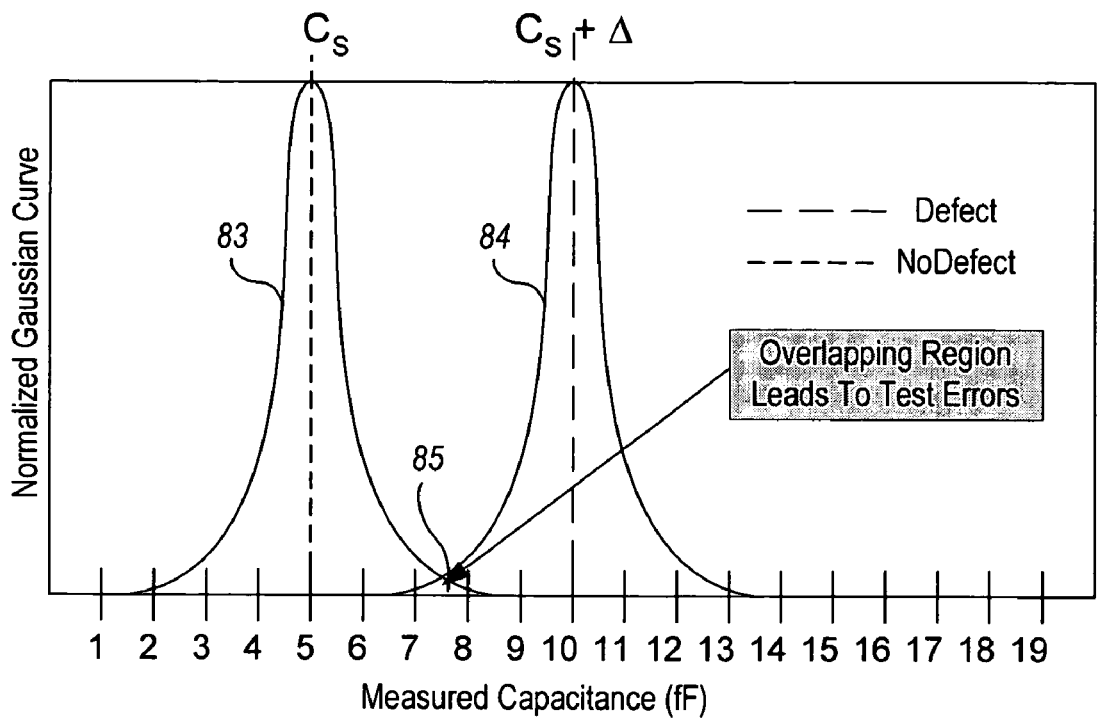
FIG. 3 is a graph illustrating capacitance measurement bell curves for capacitive measurement of a node exhibiting no defect and a node exhibiting a defect as measured on a tester with high measurement uncertainty and the same Δ as in FIG. 2.
Figure 4:
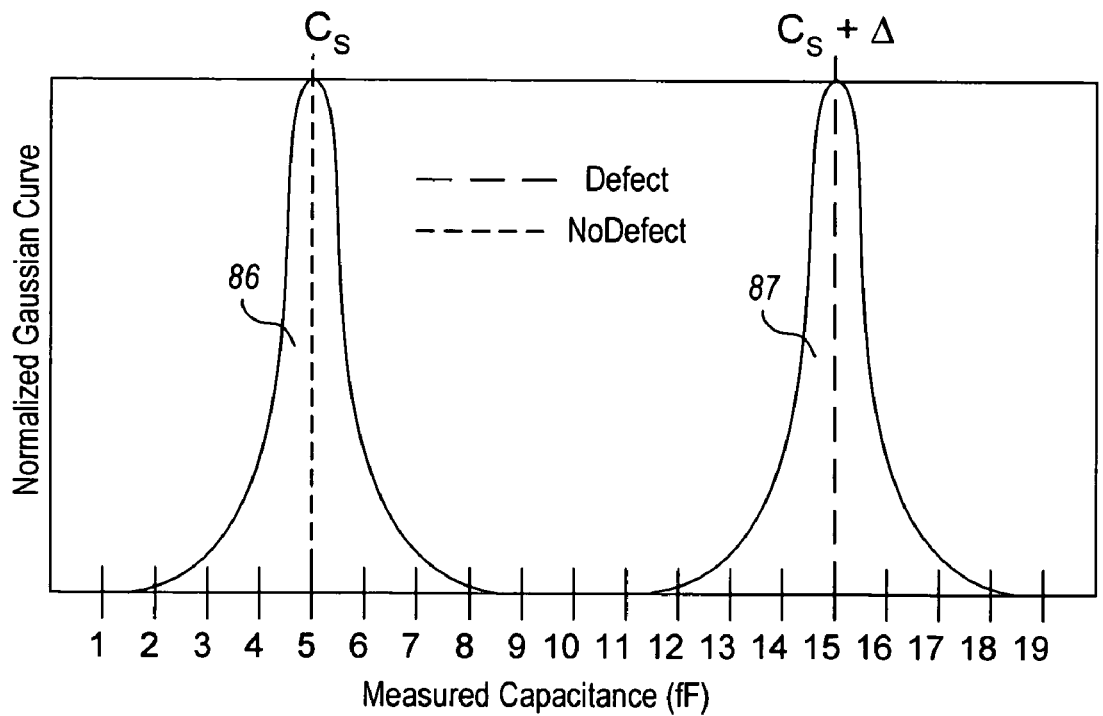
FIG. 4 is a graph illustrating capacitance measurement bell curves for capacitive measurement of a node exhibiting no defect and a node exhibiting a defect as measured on a tester with high measurement uncertainty and a larger Δ.

In some designs, there may not exist a minimum of two accessible pins that are capacitively coupled to the node-under-implicit test, or alternatively, all accessible pins that are capacitively coupled to the node-under-implicit test are only weakly capacitively coupled to the node-under-implicit test. In these situations, it may be that the prior art test setup of FIG. 1 or other capacitive sensing probe techniques will result in better performance for the particular node-under-implicit test. The present invention can still be employed for those nodes-under-implicit-test that have a minimum of two pins capacitively coupled to the respective node-under-implicit-test and where the coupling capacitance values $C_{c1}$ and $C_{C2}$ are large enough to prevent the overlap problem illustrated in FIG. 3.

Figure 11:
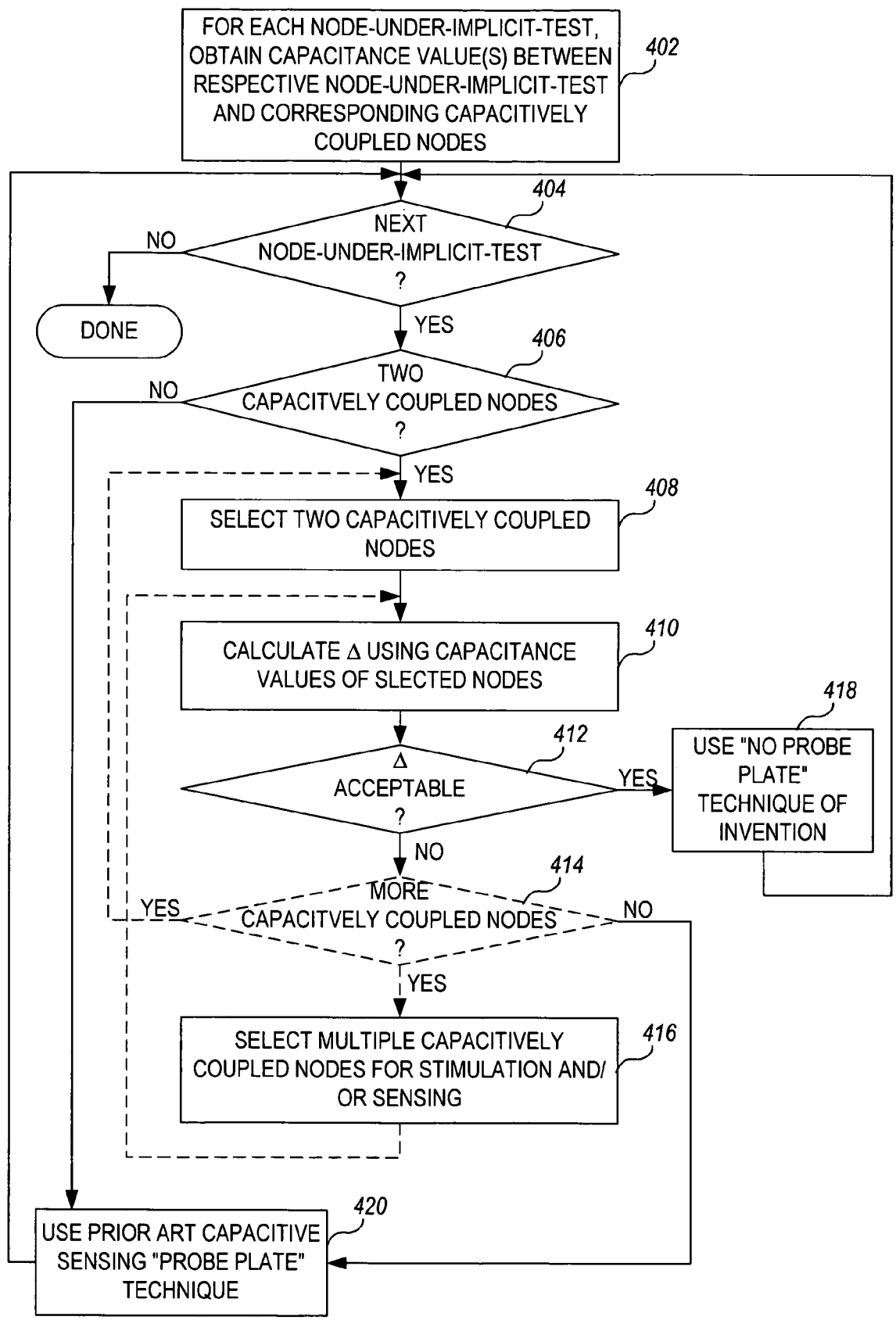
FIG. 11 is a flowchart of a method for determining which of the technique of the present invention or a capacitive sensing technique of the prior art that utilizes a probe sensing plate would result in better performance for diagnosing open connections on nodes-under-implicit-test of an electronic device.

FIG. 11 illustrates a method for determining which of the technique of the present invention or a capacitive sensing technique of the prior art that utilizes a probe sensing plate would result in better performance for diagnosing open connections on nodes-under-implicit-test of an electronic device. In this regard, during test development (i.e., prior to production runs), the capacitive coupling values between accessible pins and nodes-under-implicit-test are determined (step 402). For each node-under-implicit-test, the method then determines whether the present invention or a prior art capacitive sensing technique (utilizing a probe sensing plate) should be used for diagnosing open defects on that particular node-under-implicit-test (steps 404–420). If a node-under-implicit-test does not have a minimum of two accessible nodes capacitively coupled to it (determined in step 406), a prior art capacitive probe plate sensing technique must be used to test the respective node-under-implicit-test (assigned in step 420). If the node-under-implicit-test does have a minimum of two accessible nodes, two nodes, preferably having the highest coupling capacitance values, are selected (step 408). The coupling capacitance values (e.g., $C_{c1}$ and $C_{c2}$) are used to determine the Δ value representing the difference between open and good connections on the node-under-implicit-test (step 410). If the Δ value is acceptable (determined in step 412), the nodes corresponding to the values of coupling capacitance are used for the stimulus and sensing nodes and the technique of the present invention is used to diagnose opens on the node-under-implicit-test for production test runs (assigned in step 418). If the Δ value is not acceptable, and if additional nodes are capacitively coupled to the node-under-implicit-test (determined in step 414), either steps 408 through 412 are repeated if the nodes with the highest coupling capacitance values were not already selected, or the coupling capacitance values of the additional capacitively coupled node(s) are added on either the stimulus side or the sensing side (step 416) (representing multiple-node-stimulus and/or multiple-node-sensing discussed with respect to FIG. 9) and steps 410 and 412 are repeated to determine the Δ value representing the difference between open and good connections on the node-under-implicit-test. If the Δ value in step 412 is acceptable, the nodes corresponding to the values of coupling capacitance are used for the stimulus and sensing nodes and the technique of the present invention is used to diagnose opens on the node-under-implicit-test for production test runs. If the Δ value is not acceptable, a prior art capacitive probe plate sensing technique would result in better performance for diagnosing opens on the particular node-under-implicit-test (step 420).

The technique of FIG. 11 would preferably be used during test development and debug prior to manufacture of the tester fixture(s). The technique of FIG. 11 may be used to ensure that all nodes-under-implicit-test are tested using the technique that utilizes the least amount of fixture hardware (i.e., using the "no-plate" solution of the invention, if possible, resulting in less cost and test setup) while ensuring acceptable test performance.

From the above detailed description of the invention, it will be appreciated that the advantages offered by the invention are numerous. First, the invention allows non-contact testing of nodes of electronic circuits, including fixed or tied nodes and even inaccessible nodes of a circuit. Second, Δ may be modified through selection of the stimulus and response nodes used in the test. For example, selection of one or multiple stimulus and response nodes that are highly capacitively coupled with the node-under-implicit-test will increase the Δ of the test. In addition, due to the ability for achieving a larger Δ, the software diagnosis can be improved and the class of open faults that can be detected can be widened. Furthermore, the elimination of sense plate hardware reduces the hardware, and installation and debug time for setting up the test, which results in cost savings.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. For example, it should be understood that although the illustrative embodiments describe a test setup for testing a node (i.e., pin) of an integrated circuit, the principles of non-contact testing using capacitively coupled device nodes as provided by the invention may be extended to test nodes of devices other than integrated circuits. It is also possible that other benefits or uses of the currently disclosed invention will become apparent over time.

What is claimed is:

1. A method for testing for a defect condition on a node-under-implicit-test of an electrical device, the method comprising the steps of:
   stimulating a first node of the electrical device that is capacitively coupled to the node-under-implicit-test with a known source signal;
   physically connecting a measuring device to a second node of the electrical device that is capacitively coupled to the node-under-implicit-test; and
   measuring, with the measuring device, a signal present on the second node, the measured signal indicative of a presence or a non-presence of a defect condition on the node-under-implicit test.

2. The method of claim 1, wherein:
   the first node comprises an input and/or output signal node of the electrical device; and
   the second node comprises a different input and/or output signal node of the electrical device.

3. The method of claim 2, wherein:
   the electrical device comprises an integrated circuit;
   the first node comprises an input and/or output signal pin of the electrical device; and
   the second node comprises a different input and/or output signal pin of the electrical device.

4. The method of claim 3, wherein:
   the node-under-implicit-test of the electrical device comprises a fixed pin of the integrated circuit.

5. The method of claim 3, wherein:
   the node-under-implicit-test of the electrical device comprises a tied pin that is tied to at least one other node of the integrated circuit.

6. The method of claim 3, wherein:
   the node-under-implicit-test of the electrical device comprises an inaccessible node within the integrated circuit that is inaccessible for probing.

7. The method of claim 1, further comprising the step of:
   determining whether a defect condition exists on the node-under-implicit-test based on the measured signal.

8. The method of claim 7, wherein the step for determining whether a defect condition exists comprises the steps of:
   obtaining an expected measurement indicative of an expected capacitance on the node-under-implicit-test for at least one of a non-defect condition or the defect condition;
   obtaining an actual measurement from the measured signal, the actual measurement being indicative of an actual capacitance on the node-under-implicit-test;
   comparing the actual measurement with the expected measurement; and
   classifying the node-under-implicit-test as exhibiting or not exhibiting the defect condition based on results of the comparing step.

9. The method of claim 1, wherein:
   the defect condition is an open circuit.

10. The method of claim 1, wherein:
    the defect condition is a short circuit.

11. The method of claim 7, wherein:
    the defect condition is one of an open circuit or a short circuit; and
    the step for determining whether a defect condition exists comprises the steps of:
    obtaining an expected measurement indicative of an expected capacitance on the node-under-implicit-test for at least one of a non-defect condition or the defect condition;

obtaining an actual measurement from the measured signal, the actual measurement being indicative of an actual capacitance on the node-under-implicit-test;

comparing the actual measurement with the expected measurement; and classifying the node-under-implicit-test as exhibiting or not exhibiting the defect condition based on results of the comparing step.

12. A device, comprising:

a signal source which connects to and stimulates a first node of an electrical device with a known source signal, the first node being capacitively coupled to a node-under-implicit-test of the electrical device;

a measuring device which physically connects to and measures a signal present on a second node of the electrical device, the second node being capacitively coupled to the node-under-implicit-test.

13. The device of claim 12, further comprising:

classification means which classify whether a defect condition exists on the node-under-implicit-test based on the capacitively sensed signal.

14. The device of claim 12, wherein:

the electrical device comprises an integrated circuit;

the first node comprises an input and/or output signal pin of the electrical device; and the second node comprises a different input and/or output signal pin of the electrical device.

15. A method for detecting a defect condition on a node-under-implicit-test of an electrical device, the method comprising the steps of:

stimulating one or more first nodes of the electrical device with a known source signal, one or more first nodes comprising or connected to respective one or more input and/or output signal pins of the electrical device and each being capacitively coupled to the node-under-implicit-test;

physically connecting at least one measuring device to one or more second nodes of the electrical device, the one or more second nodes comprising or connected to respective different one or more input and/or output signal pins of the electrical device and each being capacitively coupled to the node-under-implicit-test; and measuring, with the at least one measuring device, corresponding signals present on the respective one or more second nodes, the measured corresponding signals indicative of a presence or a non-presence of a defect condition on the node-under-implicit test.

16. The method of claim 15, further comprising the step of:

determining whether a defect condition exists on the node-under-implicit-test based on the measured corresponding signals.

17. The method of claim 16, wherein:

the defect condition is a short on the node-under-implicit-test.

18. The method of claim 16, wherein:

the defect condition is an open on the node-under-implicit-test.

* * * * *

UNITED STATES PATENT AND TRADEMARK OFFICE
CERTIFICATE OF CORRECTION

| | | |
|---|---|---|
| PATENT NO. | : 7,208,957 B2 | Page 1 of 1 |
| APPLICATION NO. | : 11/069406 | |
| DATED | : April 24, 2007 | |
| INVENTOR(S) | : Schneider et al. | |

It is certified that error appears in the above-identified patent and that said Letters Patent is hereby corrected as shown below:

In column 12, line 14, in Claim 1, delete "node-under-implicit test" and insert -- node-under-implicit-test --, therefor.

In column 14, line 17, in Claim 15, delete "node-under-implicit test" and insert -- node-under-implicit-test --, therefor.

Signed and Sealed this

Twenty-first Day of August, 2007

JON W. DUDAS
*Director of the United States Patent and Trademark Office*